United States Patent
Hales et al.

(10) Patent No.: US 8,205,125 B2
(45) Date of Patent: Jun. 19, 2012

(54) ENHANCED CONTROL IN SCAN TESTS OF INTEGRATED CIRCUITS WITH PARTITIONED SCAN CHAINS

(75) Inventors: Alan David Hales, Richardson, TX (US); Srujan Kumar Nakidi, Adilabad (IN); Rubin Ajit Parekhji, Bangalore (IN); Srivaths Ravi, Bangalore (IN); Rajesh Kumar Tiwari, Lucknow (IN)

(73) Assignee: Texas Instruments Incorporated, Dallas, TX (US)

( * ) Notice: Subject to any disclaimer, the term of this patent is extended or adjusted under 35 U.S.C. 154(b) by 255 days.

(21) Appl. No.: 12/604,397

(22) Filed: Oct. 23, 2009

(65) Prior Publication Data

US 2011/0099442 A1  Apr. 28, 2011

(51) Int. Cl.
*G01R 31/3177* (2006.01)
*G01R 31/40* (2006.01)

(52) U.S. Cl. ........................ 714/729; 714/727
(58) Field of Classification Search .................. None
See application file for complete search history.

(56) References Cited

U.S. PATENT DOCUMENTS

| | | | | |
|---|---|---|---|---|
| 5,812,561 A | * | 9/1998 | Giles et al. | 714/726 |
| 5,991,909 A | * | 11/1999 | Rajski et al. | 714/729 |
| 6,055,649 A | * | 4/2000 | Deao et al. | 714/30 |
| 2001/0019503 A1 | * | 9/2001 | Ooishi | 365/191 |
| 2003/0009714 A1 | * | 1/2003 | Evans | 714/726 |
| 2003/0154433 A1 | * | 8/2003 | Wang et al. | 714/726 |
| 2005/0015213 A1 | | 1/2005 | Somervill et al. | |
| 2006/0100810 A1 | | 5/2006 | Van De Logt et al. | |
| 2010/0211839 A1 | * | 8/2010 | Almukhaizim et al. | 714/729 |
| 2010/0313089 A1 | * | 12/2010 | Rajski et al. | 714/731 |

FOREIGN PATENT DOCUMENTS

| | | |
|---|---|---|
| JP | 2001318125 A | 11/2001 |
| JP | 2007263866 A | 10/2007 |
| WO | 2004003967 A2 | 1/2004 |

OTHER PUBLICATIONS

"Lee Whetsel .,", "Adapting Scan Architectures for Low Power Operation", IEEE, Copyright Date: 2000, Paper 33.1 pp. 863-872.

* cited by examiner

*Primary Examiner* — Ajay Bhatia
*Assistant Examiner* — Dipakkumar Gandhi
(74) *Attorney, Agent, or Firm* — Robert D. Marshall, Jr.; Wade James Brady, III; Frederick J. Telecky, Jr.

(57) ABSTRACT

A test controller implemented in an integrated circuit (IC) with partitioned scan chains provides enhanced control in performing scan tests. According to an aspect, a test controller can selectively control scan-in, scan-out and capture phases of scan chains for different scan chains of the IC to be independent. The number of pins required to interface the test controller with an external tester is less than the number of partitions that the test controller can support. According to another aspect, an IC includes a register corresponding to each partition to support transition fault (or LOS) testing. According to another aspect, an IC with partitioned scan chains includes serial to parallel and parallel to serial converters, thereby minimizing the external pins required to support scan tests.

4 Claims, 13 Drawing Sheets

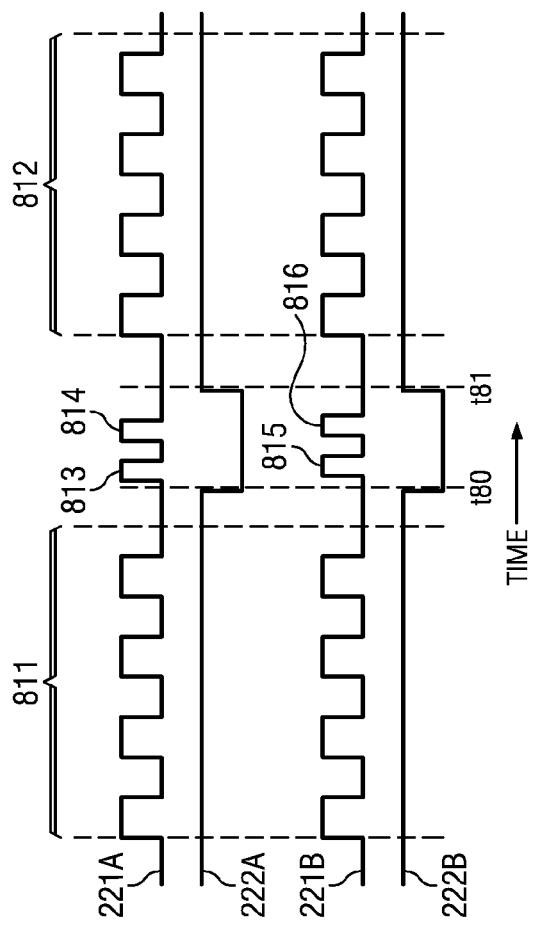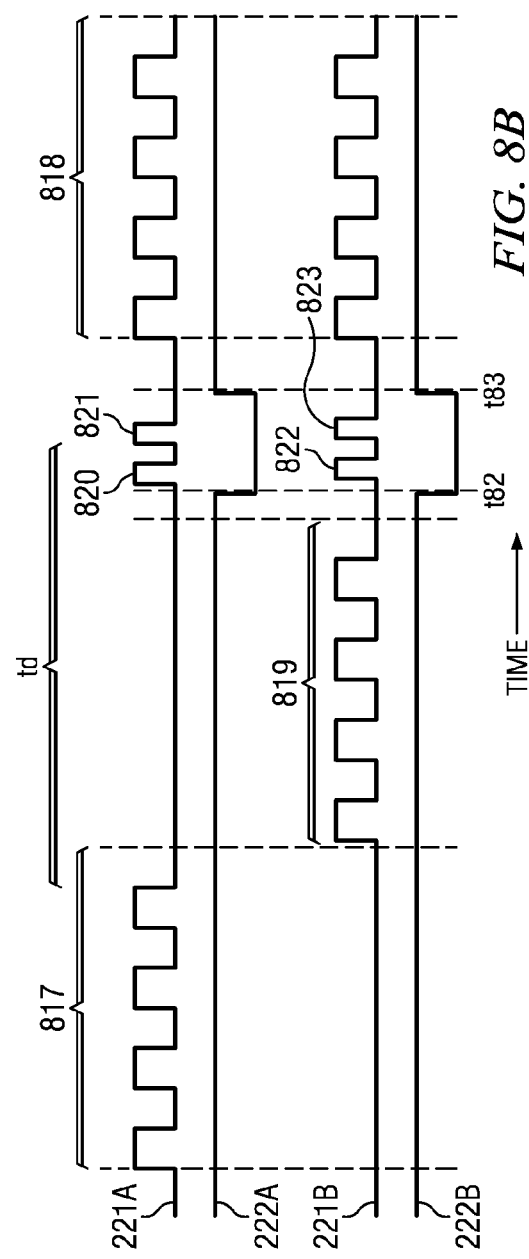

| CASE | LAUNCH (L)/CAPTURE (C) CLOCKS |
|---|---|
| A | L:P1,C:P1 |
| B | L:{P1,P2},C:P1 |
| C | L:P1,C:P2 |
| D | L:{P1,P2},C:{P1,P2} |
| E | L:P1,C:{P1,P2} |

ENHANCED CONTROL IN SCAN TESTS OF INTEGRATED CIRCUITS WITH PARTITIONED SCAN CHAINS

BACKGROUND OF THE INVENTION

1. Technical Field

Embodiments of the present disclosure relate generally to testing of integrated circuits, and more specifically to providing enhanced control in scan tests of integrated circuits with partitioned scan chains.

2. Related Art

Scan-based tests (scan tests) are often performed to test integrated circuits (IC). A scan test generally refers to a test approach in which storage elements (e.g., flip-flops) in an IC are connected as a scan chain, a test vector is shifted into the scan chain via input test pins provided on the IC, the IC is placed in an evaluation mode (capture phase) to cause the inputs to be evaluated, and a corresponding response vector obtained in the capture cycle is shifted out via output test pins. The bit values in the response vector are compared with an expected output to determine any fault conditions in the IC.

ICs are often designed with partitioned scan chains, implying that each partitioned scan chain contains a corresponding set of storage elements which are operable as a scan chain to receive a corresponding test vector. Partitioned scan chains are used for reasons such as testability of desired set of partitions in isolation, operability of different partitions in different frequencies, power management, etc., as is well known in the relevant arts.

It is generally desirable that more control be provided in such environments so that tests suitable in corresponding environments may be employed.

SUMMARY

This summary is provided to comply with 37 C.F.R. §1.73, requiring a summary of the invention briefly indicating the nature and substance of the invention. It is submitted with the understanding that it will not be used to interpret or limit the scope or meaning of the claims.

A test controller implemented in an integrated circuit (IC) with partitioned scan chains provides enhanced control in performing scan tests. According to an aspect, a test controller can selectively control scan durations for different scan chains of the IC to be independent. Independence manifests in the ability to select the scan duration (start and length of the duration) for a partition without regard to the scan duration for another partition for a same test. This implies that any two scan durations can be either overlapping or non-overlapping as suited in the specific situation. The number of pins required to interface the test controller with an external tester is less than the number of partitions that the test controller can support.

According to another aspect, an IC includes a register having a bit corresponding to each partition to support transition fault launch-on shift (or LOS) testing when each scan chain can be scanned independently. The register is used to store the last bit of a first vector scanned in to a first scan chain, and provided along with the last bit of a second vector scanned into a second scan chain. The circuit is evaluated soon after scanning in the two last bits (into respective chains) to perform LOS testing. The register may contain multiple bits to store the last bit of multiple scan chains such that LOS testing can be supported associated with multiple scan chains.

According to yet another aspect, an IC with partitioned scan chains includes serial to parallel (SPC) and parallel to serial (PSC) converters, thereby minimizing the external pins required to support scan tests. In an embodiment, smaller data units are provided at higher frequency to the SPC, which concatenates multiple smaller data units to form a larger unit, the bits of which are then scanned into corresponding scan chains. The number of pins on the IC to receive bits from an external tester, is thus reduced. The converse logic may be used in the PSC also to reduce the number of pins to send scanned out data. Several aspects of the invention are described below with reference to examples for illustration.

It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well-known structures or operations are not shown in detail to avoid obscuring the features of the invention.

BRIEF DESCRIPTION OF THE VIEWS OF DRAWINGS

Example embodiments of the present invention will be described with reference to the accompanying drawings briefly described below.

FIGS. 8A and 8B are example timing diagrams illustrating the manner in which launch off capture (LOC) tests may be performed, in an embodiment.

DETAILED DESCRIPTION

Various embodiments are described below with several examples for illustration.

1. Example Environment

Figure 1:
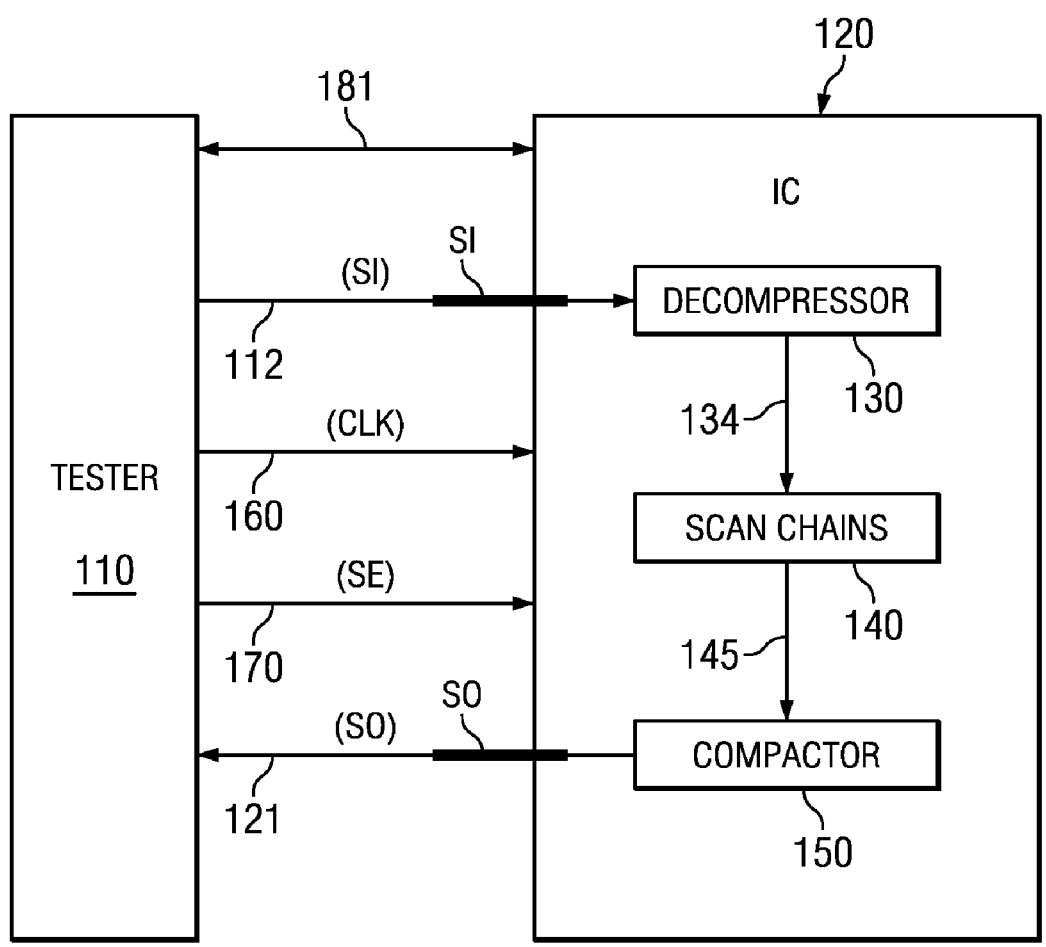
FIG. 1 is a block diagram of an example environment in which several features of the present invention can be implemented.

FIG. 1 is a block diagram of an example environment in which several features of the present invention can be implemented. The diagram is shown containing tester 110 and IC 120. IC 120 (which may be a system-on-chip/SoC) is shown containing decompressor 130, scan chains 140 and compactor 150. For conciseness, only a single IC is shown in the Figure. However, multiple ICs can be tested simultaneously using tester 110.

Tester 110 provides test vectors in compressed form on path 112 (SI) to decompressor 130 in IC 120, and receives response vectors representing the captured results of the test in compressed form on path 121 (SO) from compactor 150. Tester 110 may compare the bit values in the response vectors with expected values to determine faults in IC 120. Tester 110 provides scan-enable signal (SE) on path 170, and one or more clocks via path 160 (CLK) to IC 120, with the clock(s) coordinating the operation of IC 120 during scan tests. Tester 110 may also provide configuration data for specifying configuration of clocks and generating control signals in IC 120, for specifying the number of partitions in IC 120, etc., via path 181.

Decompressor 130 decompresses test vectors received on path 112 (SI), and provides test vectors in uncompressed form to scan chains 140 via path 134. Compactor 130 compresses response vectors received on path 145, and provides corresponding compressed response vectors to tester 110 via path 121 (SO). The decompressor and compactor modules can be implemented using various approaches based on combinational and/or sequential circuits, as is well known in the relevant arts.

Scan chains 140 contain the flip-flop elements of IC 120, which are sought to be tested using scan-based approaches. The memory elements may be designed to be operated as one or more scan chains (which may be implemented, for example, as partitioned scan chains), each containing storage element(s) that are connected as a shift register during shifting-in of test vectors, and shifting-out of response vectors. A response vector contains the results (response bits) of evaluation of combinatorial logic (during a capture cycle) that is under test once the shifting-in of a test vector is complete.

Though not shown for conciseness, IC 120 contains various other elements, for example, combinatorial logic elements also, which in combination with the memory elements in scan chains 140, operate to provide the utility IC 120 is designed for. In addition, IC 120 may contain corresponding circuitry (e.g., a test controller) to generate various clock and control signals internally used in coordinating scan test operations and provided to storage elements in scan chains 140. The clocks may be generated based on clock 160 (CLK) received from tester 110. It is noted that paths SI and SO may contain/represent multiple signal lines (with each line transferring a single bit at a given time), and accordingly, IC 120 may contain a corresponding number of pins to connect to the signal lines, and shown marked SI and SO.

Several features of the present invention enable enhanced control in scan tests of integrated circuits with partitioned scan chains. Accordingly, the details of an example IC containing scan chains is described next.

2. IC

Figure 2:
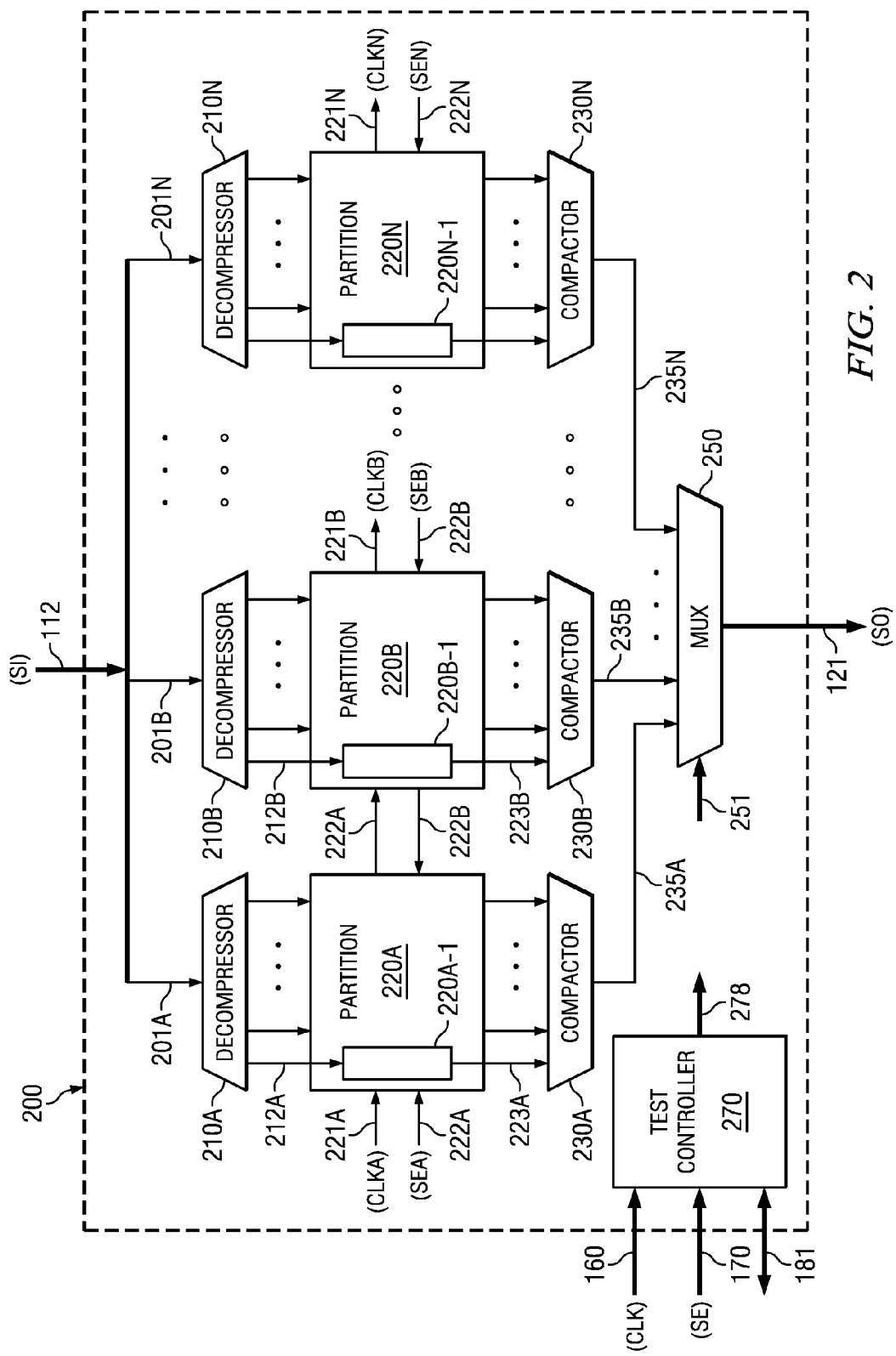
FIG. 2 is a block diagram illustrating an IC with multiple scan partitions in an embodiment of the present invention.

FIG. 2 is a block diagram illustrating the details of an IC in an embodiment. IC 200, which may be used in place of IC 120 of FIG. 1, is shown containing decompressors 210A through 210N, partitions 220A through 220N, compactors 230A through 230N, multiplexer (MUX) 250 and test controller 270.

Each of the decompressors 210A through 210N decompresses compressed test vectors received via signal lines 112 (SI), and provides decompressed vectors to scan chains in corresponding partitions. Path 112 (SI) represents multiple scan-in paths (signal lines/data paths), some or all of which may be provided to each of decompressors 210A through 210N, based for example, on the number of scan chains in each of partitions 220A-220N. Thus for example, while path 112 (SI) may contain sixteen separate signal lines/data paths, decompressors 210A-210N may each be connected to all sixteen scan-in paths or a number of scan-in paths less than sixteen, i.e., each of scan-in paths 201A-201N (connected to respective decompressors 210A-210N) may be 16-bits wide, or less. Further, the number of scan-in paths connected to one decompressor may be different from the number of scan-in paths connected to another decompressor, and therefore the number of (simultaneous) input vectors received by one decompressor may be different from that received by another decompressor.

Partitions 220A through 220N may each contain one or more scan chains formed of storage elements, with the scan chains in each partition typically being operable by a corresponding clock. The clocks may be all synchronous with respect to each other, or have different phase/frequency relationships with respect to each other. Thus, scan chain elements in partitions 220A-220N are shown clocked by respective clocks 221A (CLKA) through 221N (CLKN). In an embodiment, clocks 221A-221N are synchronous with respect to each other. In general, each of the partitions (which may contain multiple scan chains) may be viewed as a single scan chain.

Each of the partitions may receive data inputs from the other partitions via 'inter-partition paths'. Each inter-partition path transfers a data value from a memory element (register, flip-flop, etc.) in one partition to a memory element in the other partition, with any combinatorial logic in between. The combinatorial logic may be viewed as being contained within the logic path/arrow shown in FIG. 2. For example, partition 220A may receive one or more data inputs from partition 220B via path 222B, and provide one or more data inputs to partition 220B on path 222A. Although not shown, such inter-partition data paths may be present between other pairs of partitions as well. Also, the data input provided on path 222B may be further evaluated/processed by memory elements in partition 220A, which in turn provide the data input on path 222A.

During scan-based testing, in each of the partitions, one or more scan chains may be formed using memory/storage elements (e.g., flip-flops). For ease of description, only one scan chain each (scan chain 220A-1 in partition 220A, scan chain 220B-1 in partition 220B, and scan chain 220N-1 in partition 220N) are shown in FIG. 2. However, each partition may contain multiple scan chains. In general, a partition refers to a portion of an IC providing a defined/specific function (e.g., ALU, USB Controller, may be provided as respective functional blocks).

Scan chain 220A-1 receives decompressed test vectors on path 212A, and provides response vectors on path 223A. Similarly, scan chain 220B-1 receives decompressed test vectors on path 212B, and provides response vectors on path 223B. Other scan chains in partition 220A as well as in partitions 220B through 220-N operate in a correspondingly similar manner.

Compactors 230A through 230N receive response vectors from (the scan chains in) respective partitions 220A through 220N, compress the response vectors, and provide the compacted/compressed response vectors via respective 'scan-out' paths 235A through 235N. Paths 235A-235N may each contain multiple paths, and in an embodiment respectively contain the same number of paths as in scan-in paths 201A-201N.

MUX 250 provides on test output 121(SO) one of inputs 235A-235N, based on the value of select signal 251. Thus, path 121 (SO) may represent multiple output signal lines.

Decompression in the decompressors and compaction in the compactors may be performed using any of several well-known techniques. In an embodiment, decompressors 210A-210N and compactors 230A-230N are implemented using combinatorial elements. However, in other embodiments, the decompressors and compactors can be implemented using sequential (clocked) elements, or a combination of combinatorial and sequential elements. It is also noted that while IC 200 is described above as containing decompressors and compactors, the implementation of the decompressors and compactors may be required only for reasons such as to reduce the storage requirements of an external device (e.g., tester) providing the test vector(s), to reduce test application time and hence test cost, to reduce the number of tester pins, etc. Several features of the present invention can be implemented in an IC not having decompressors and compactors, as well.

Test controller 270 receives master clock 160 (CLK) and master scan enable SE (170) from a tester (e.g., tester 110), and generates clock and scan enable signals for each of partitions 220A-220N. As described in detail below, test controller 270 provides enhanced control in generating the clock signals (221A-221N) and scan enable signals (222A-222N), which are deemed to be contained in path 278. Test controller 270 generates select signal 251 provided to MUX 250. Test controller 270 may receive configuration data provided by a tester on path 181.

Test controller 270 provides enhanced control while performing scan-based tests in partitioned scan-chains (i.e., scan chains in different partitions 220A-220N). Such enhanced control includes scanning-in of test vectors into some partitions, while not scanning-in test vectors into some other partitions, scanning-in of test vectors in parallel into all partitions or into some partitions only, etc. According to an aspect of the present invention, test controller 270 provides such enhanced control while containing fewer control pins interfacing with a tester (e.g., tester 110) which specify the specific partitions that are to be enabled/disabled, which can be any subset of (less than) the total number of partitions that it controls. The description is continued with an illustration of such circuitry in an embodiment.

4. Partition Selector

Figure 3:
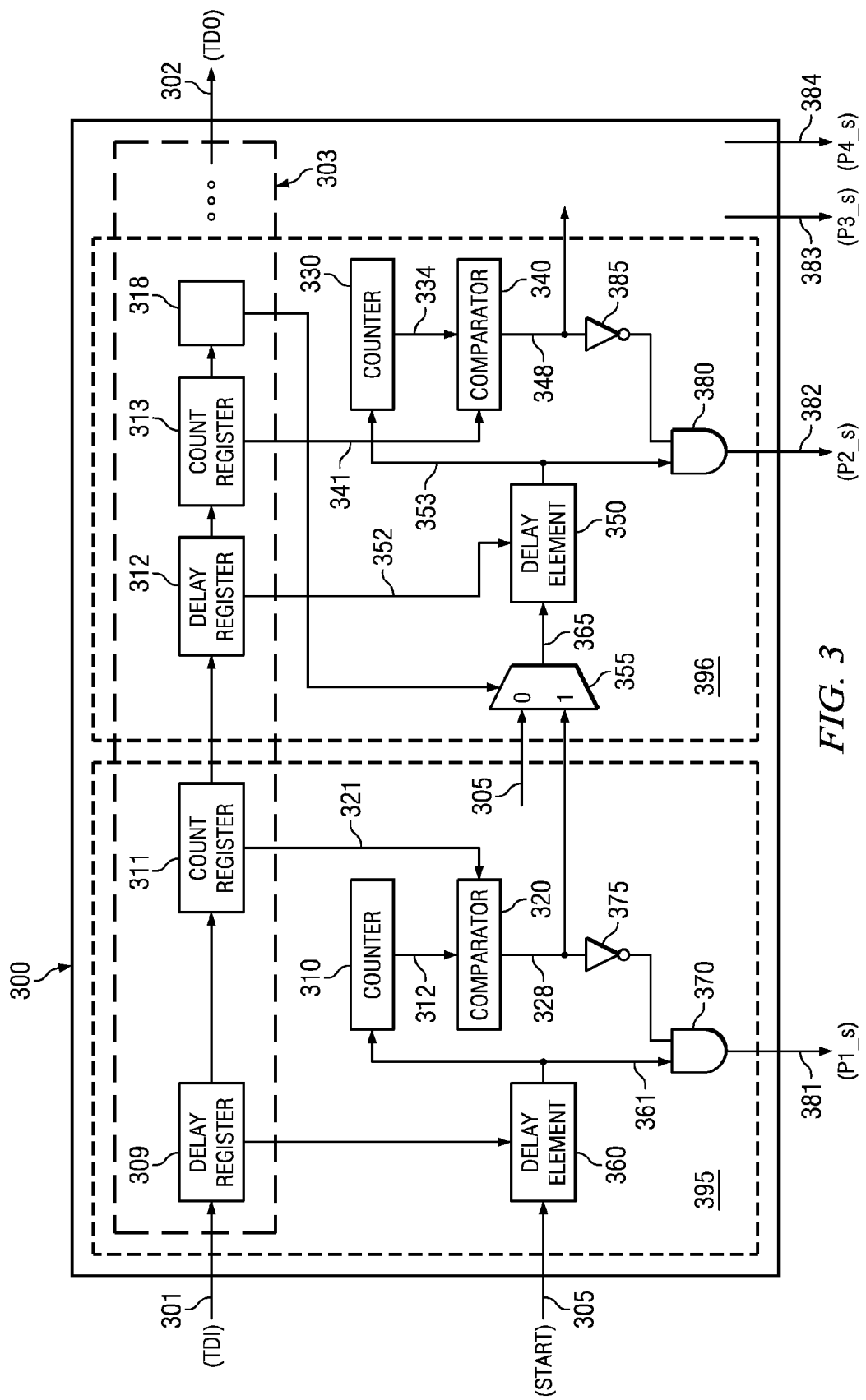
FIG. 3 is a block diagram of a partition selector circuit implemented in an IC with partitioned scan chains, in an embodiment of the present invention.

FIG. 3 is a block diagram of a partition selector circuit implemented in (a test controller 270 of) an IC with partitioned scan chains, in an embodiment of the present invention. Partition selector 300 of FIG. 3 is assumed to be implemented to generate partition select (partition enable/disable) signals for four partitions P1 through P4, although only components/blocks corresponding to two partitions are shown in the Figure. Further, more or fewer than four partitions can be supported, by appropriate configuration and/or replication of the blocks/components shown in FIG. 3, as would be apparent to one skilled in the relevant arts upon reading the disclosure herein.

Blocks 395 and 396 respectively generate corresponding select signals 381 (P1_s) and 382 (P2_s) for partitions P1 and P2. Two more blocks similar or identical to block 396, each for generation of select signal for partitions P3 and P4 are not shown, but are assumed to be present, and generate respective select signals 383 (P3_s) and 384 (P4_s) for partitions P3 and P4. Blocks such as 395, 396 and those corresponding to partitions P3 and P4 are referred to as stages.

Delay registers 309 and 312, count registers 311 and 313, and bypass register 318 form part of the boundary scan registers (303) of IC 200 according to the IEEE 1149.1 Standard JTAG specification. Boundary scan registers 303 are configured to containing a delay register and count register for each of the four partitions (e.g., delay register 312 and count register 313 for the second partition), and bypass registers for all partitions except partition P1.

As described in sections below, the count register specifies the length of the scan duration and the delay register specifies a delay relative to a start signal. The start signal for the first stage is received from tester 110 (as signal 305), while for the following stages, the start signal is determined by the value in the corresponding bypass register. The value provided by a bypass register specifies whether the start signal for a stage is provided by the output of a previous stage or signal 305 directly from tester 110. The effect of the values set in these registers is such that the scan start and scan duration of each partition can be controlled independently by appropriate programming (by tester 110) of each register in boundary scan registers 303.

Boundary scan registers 303 receive, from an external tester, digital values serially via pin TDI (301) of IC 200. The data values stored in the count register, delay register and bypass register may be viewed as digital data indicating a corresponding specific duration in which the scan chains in the associated partition are placed in a scan mode. While configuration according to the approach of FIG. 3 does not require the use of output pin TDO (302), pin TDO (302) may be used (optionally) for observability of various data. For example, the data values programmed into portions of boundary scan registers 303 (done through TDI) can be checked on TDO (302).

The registers in boundary scan registers 303 are shown connected in series such that a single pin (on tester) can possibly be used to provide the data bits which control the specific partitions that are scanned in each time instance (or corresponding clock period). However, alternative approaches can be employed to use more pins/paths from tester 110, but with the number of such pins/paths being fewer than the number of partitions sought to be controlled. Several such approaches, without departing from the scope and spirit of several aspects of the present invention, will be apparent to one skilled in relevant arts by reading the disclosure provided herein.

Block 395 contains delay register 309, count register 311, counter 310, comparator 320, delay element 360, inverter 375 and AND gate 370. Block 396 similarly contains delay register 312, count register 313, counter 330, comparator 340, MUX 355, delay element 350, inverter 385 and AND gate 380. Signal 305 (Global Start) is also provided by the external tester. For conciseness, the description is provided only with respect to block 396, though the description is applicable to similar elements of block 395 as well.

Multiplexer 355 selects either global start signal 305 or scan end signal 328 of previous block 395 as local start signal based on the value of bypass register 318. Thus, the start of scan for each non-first partition can be controlled relative to the end of scan of a previous partition or global start 305. Delay element 350 delays local start signal by a duration specified by delay register 312 and forwards the delayed signal to both AND gate 380 and counter 330.

Counter 330 starts counting (from 0) beginning from the receipt of the rising edge of the delayed signal 353 and comparator 340 indicates the end of the scan cycle when the value in count register 313 and counter 330 are equal. Inverter 385 inverts the logic level of signal 348. AND gate 380 receives the output of inverter 385 and signal 353, and generates scan enable signal P2_s for the second partition by AND operation of signals 353 and the inverse of signal 348. The operation of the circuit of FIG. 3 is illustrated in further detail with respect to the timing diagrams of FIGS. 4A and 4B below.

4. Timing Diagrams for Partition Scan Enable

Figure 4A:
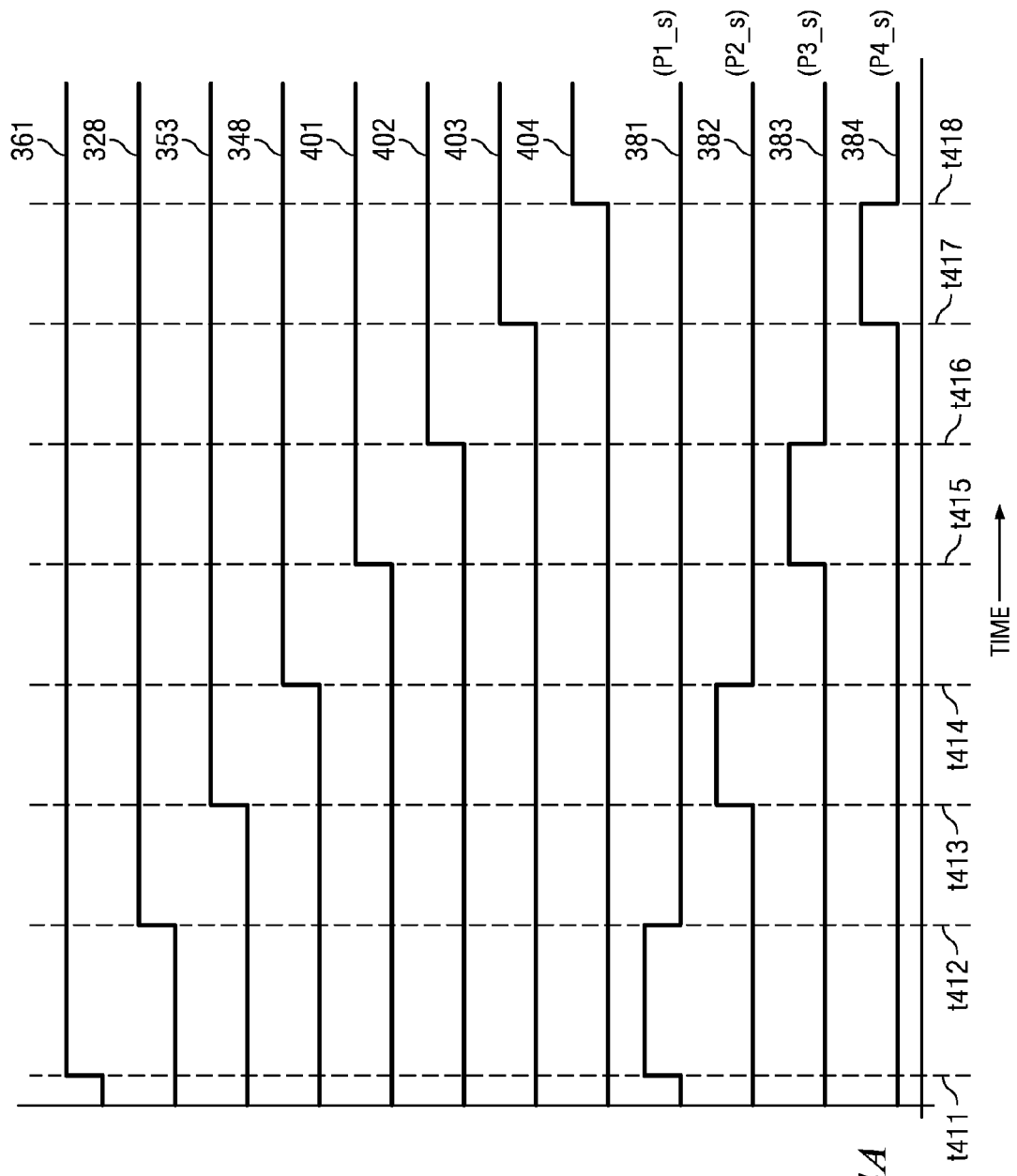
FIG. 4A is a timing diagram illustrating waveforms during a scan test in an IC, in an embodiment of the present invention.

FIG. 4A is a waveform illustrating the manner in which sequential (non-overlapping) scan-in of test vectors can be performed for the four partitions P1-P4. Delay register 309 is assumed to be loaded with a zero delay value. Count registers 311 and 313 and delay register 312 (as well as delay registers and count registers for corresponding partitions P3 and P4 are assumed to be loaded with desired count values. All bypass registers (e.g., 318) are loaded with logic high values implying that the scan operation is to start following the end of the scan of the previous partition.

Signal 305 (Global Start) is asserted to logic high, and is forwarded by delay element 360 with zero delay. Hence, at time instance t411 signal 361 goes to logic high, and causes counter 310 to start counting. Comparator 320 compares count values on paths 312 and 321. At time instance t412, count value 312 of counter 310 equals the count value initialized in count register 311, and comparator 320 provides logic high on path 328. AND gate 370 receives signal 361 as well as the logical inverse of signal 328 (from inverter 375), and generates in interval t411-t412, a logic high on output 381 (P1_s). Interval t411-t412, thus, represents the interval during which test vectors are scanned-in into partition P1, and is determined by (equals) the count value in count register 311.

The logic high transition on path 328 is forwarded by MUX 355 on path 365 (due to select signal from bypass register 318 being logic high), and in turn is forwarded by delay element 350 as a logic high transition at time instance t413 (on path 353). Delay element 350 generates delay t413-t412 based on the delay count received from delay register 312 on path 352.

Signal 353 being asserted to logic high at time instance t413 causes counter 330 to start counting. Comparator 340 compares count values on paths 334 and 341. At time instance t414, count value 334 of counter 330 equals the count value (path 341) initialized in count register 313, and comparator 340 provides logic high on path 348. AND gate 380 receives signal 353 as well as the logical inverse of signal 348 (from inverter 385), and generates, in interval t413-t414, a logic high on output 382 (P2_s). Interval t413-t414, thus, represents the interval during which test vectors are scanned-in into partition P2, and is determined by (equals) the count value in count register 313.

The logic high transition on path 348 is forwarded to the next stage, and operations in the stages corresponding to P3 and P4 are similar to that described above with respect to stages/blocks 395 and 396. Signals 401 and 403 of FIG. 4A represent signals that correspond respectively to signals 361 and 353, but for partitions P3 and P4 respectively. Similarly, signals 402 and 404 represent signals that correspond respectively to signals 328 and 348, but for partitions P3 and P4 respectively. Signals 383 (P3_s) and 384 (P4_s) represent the select signals generated for partitions P3 and P4, and as shown in FIG. 4A.

Figure 4B:
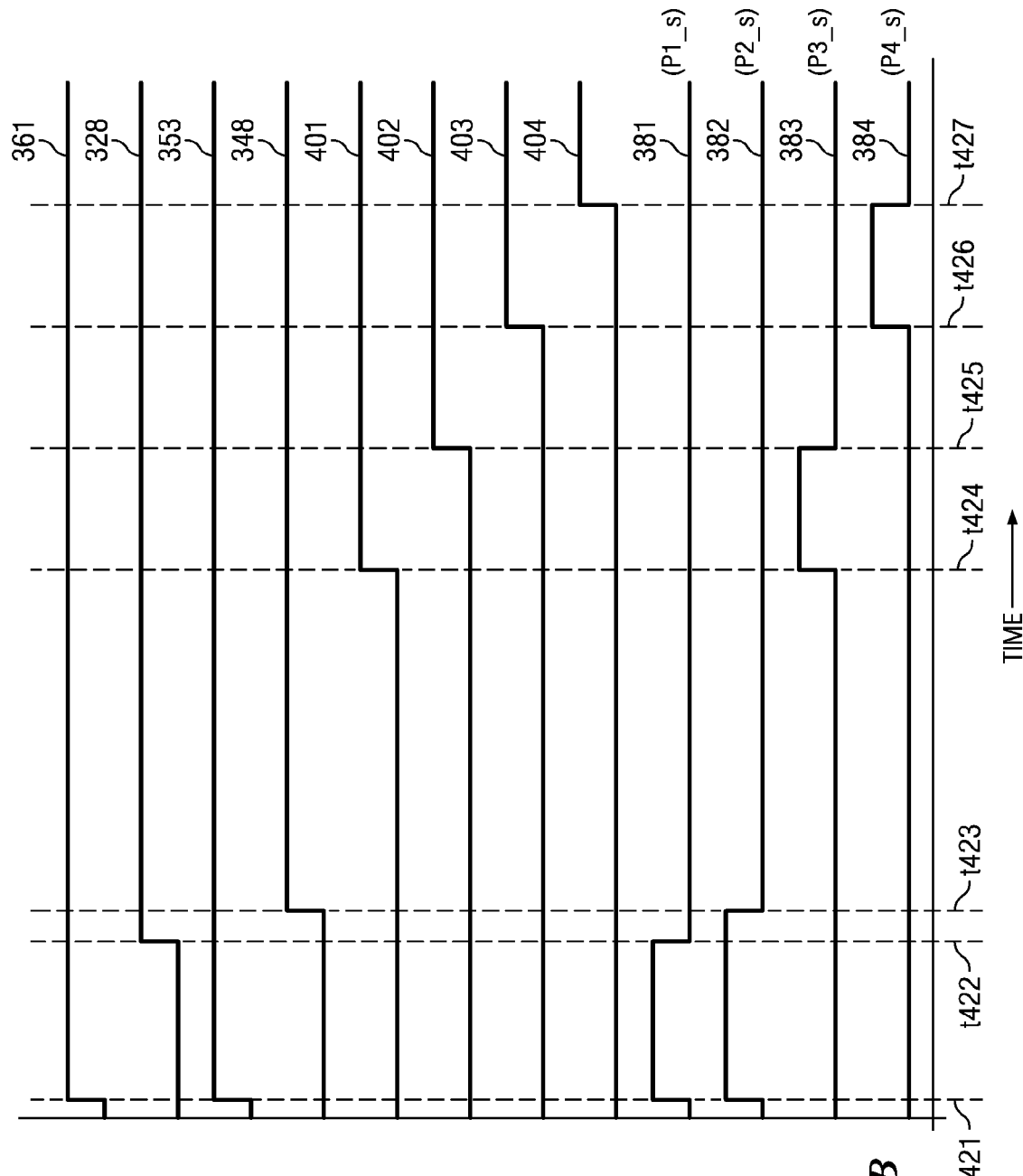
FIG. 4B is another timing diagram illustrating waveforms during a scan test in an IC, in an embodiment of the present invention.

FIG. 4B is a waveform illustrating the manner in which scan-in phase of test vectors for partitions P1 and P2 overlap in time, while scan-in phase of partitions P3 and P4 are sequential (non-overlapping). Delay registers 309 and 312 are assumed to be loaded with a zero delay value. Count register 311 and 313 and delay register 312 (as well as delay registers and count registers corresponding partitions P3 and P4 are assumed to be loaded with desired count values. Select input of MUX 355 is provided by bypass register 318 as logic low (rather than logic high corresponding to the waveforms of FIG. 4A). However select inputs of multiplexers corresponding to partitions P3 and P4 are provided as logic high.

As a result of delay register 309 and 312 having a zero delay count, counters 310 and 330 start counting simultaneously, as indicated by both signals 361 and 353 asserted to logic high at time instance t421 in FIG. 4B.

Comparator 320 compares count values on paths 312 and 321. At time interval t422, count value 312 of count register 310 equals the count value initialized in count register 311, and comparator 320 provides logic high on path 328. AND gate 370 generates, in interval t421-t422, a logic high on output 381 (P1_s). Interval t421-t422, thus, represents the interval during which test vectors are scanned-in into partition P1, and is determined by (equals) the count value in count register 311.

Comparator 340 compares count values on paths 334 and 341. At time interval t423, count value 334 of counter 330 equals the count value (on path 341) initialized in count register 313, and comparator 340 provides logic high on path 348. AND gate 380 generates, in interval t421-t423, a logic high on output 382 (P2_s).). Interval t421-t423, thus, represents the interval during which test vectors are scanned-in into partition P2, and is determined by (equals) the count value in count register 313. The logic high transition on path 348 is forwarded to the next stage, and signals 401-404 and select signals 383 (P3_s) and 384 (P4_s) are generated in a sequential and non-overlapping manner, as shown in FIG. 4B, since the start of counting in stage corresponding to partition P3 is triggered by the output 348 of stage/block 396, and the start of counting in stage corresponding to partition P4 is triggered by the corresponding output of stage corresponding to partition P3.

From the description above, it may be appreciated that enhanced control in scan tests is provided according to an aspect of the present invention. For example, while the scan-in phase of test vectors in partitions one and two substantially overlap in the example of FIG. 4B, the scan-in phase for partitions one and two are non-overlapping in the example of FIG. 4A. It may also be appreciated that with the selection and provision of the appropriate values for the counter registers, delay counter registers, and MUX selects (bypass registers) corresponding to each of the partitions, all possible combinations of sequential and overlapping phases for each of the partitions can be achieved. In general, each partition can be scanned independently (i.e., independent of the scan duration of another partition) in specific desired durations due to the control provided above.

For example, by programming a large value in delay register 309, and select of MUX 355 provided as logic low, P2_s(382) can be generated to start earlier than P1_s(381). Further, appropriate selection of values in count registers 311 and 313, the logic high duration of P2_s(382) can be designed to occur prior to and non-overlapping with (or partially overlapping with) the logic high duration of P1_s(381).

Furthermore, similar enhanced control may be provided independently for capture and scan-out phases for each of the partitions. Such enhanced control can be utilized for minimizing power dissipation/consumption. For example, computations may be done to estimate the power consumptions during a scan test, and if it is determined that the power consumption exceeds a desired limit, the scan-in, capture and/or scan-out may be performed sequentially rather than parallely.

It may also be appreciated that the approach of FIG. 3 requires fewer pins to be interfaced with an external tester (three in the example embodiment of FIG. 3) than the number of partitions that may be controlled. It is noted that the approach of FIG. 3 can support more number of partitions, without an associated increase in the number of pins required for interfacing with the external tester.

It is noted that circuitry similar to that of FIG. 3 may be replicated for generation of select signals for enabling capture and shift-out phases of a scan test for each of partitions P1-P4, independently of the select signals noted above for shift-in phases. For ease of description, the operation of the circuit of FIG. 3 only for shift-in (or scan-in) phase of test vectors is described below with respect to the timing diagrams of FIGS. 4A and 4B. However, similar control can be independently provided for the capture and shift-out (scan-out) phases as well, as will be apparent to one skilled in the relevant arts on reading the disclosure herein. It is assumed that the registers and counters of the circuit of FIG. 3 are initialized with appropriate desired values prior to operation.

Partition select signals generated by partition selector 300 are gated with the master clock and master scan enable signals provided by an external tester (tester 110) to generate corresponding clock and scan enable signals provided to each of the partitions, as illustrated next.

5. Test Controller

Figure 5:
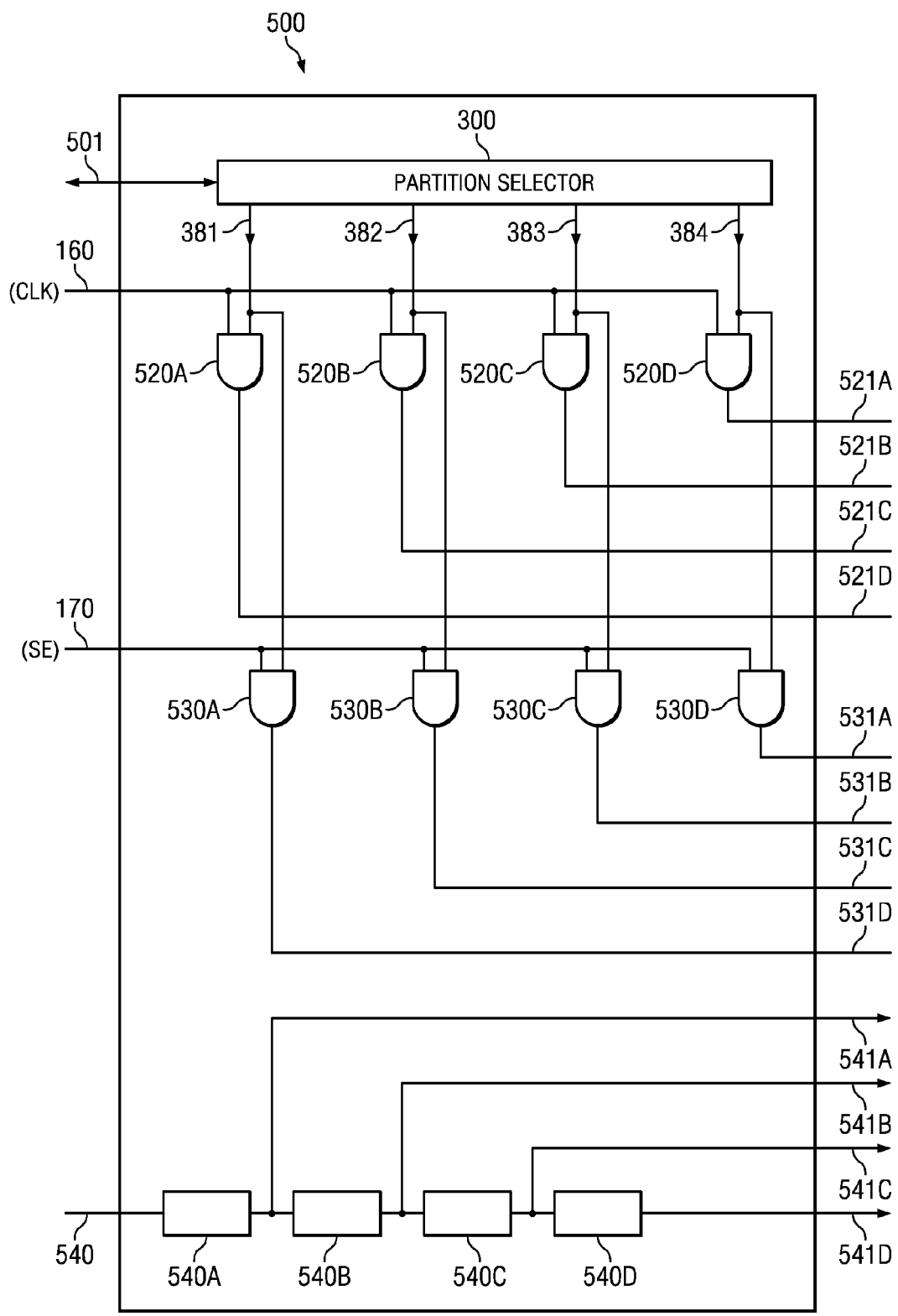
FIG. 5 is a block diagram of a test controller in an embodiment of the present invention.

FIG. 5 is a block diagram of a test controller in an embodiment of the present invention. Test controller 270 (also shown in FIG. 2) is shown containing partition selector 300, AND gates 520A-520D and 530A-530D, and registers 540A-540D. While this is one possible embodiment used for controlling the partitions, other embodiments may include providing the information directly from device pins (rather than using a test controller), or distributing control between device pins and test controller.

Further, while test controller 270 is shown implemented for supporting four partitions, similar techniques can be used for more or fewer number of partitions. Although not shown, test controller 270 may be designed to contain circuit blocks similar to partition selector 300, for independent control of partition clocks and scan enable signals for other phases (such as capture, scan-out) of a scan test as well.

Path 501 is deemed to contain paths 301, 302 and 305 of FIG. 3, and is deemed to be included in path 181 of FIG. 1. Master clock 160 (CLK) is logically ANDed with enable signals 381, 382, 383 and 384 (generated by partition selector 300) to generate partition clocks 521A, 521B, 521C and 521D for the respective ones of four partitions.

Master scan enable 170 (SE) is logically ANDed with enable signals 381, 382, 383 and 384 to generate scan enable signals 531A, 531B, 531C and 531D for the respective ones of four partitions. Logic bits shifted (via pin 540) into registers 540A-540D are provided as select signals for multiplexers used in the circuit of FIG. 9 (for transition fault testing), described in detail below.

The manner in which test vectors are generated for use in an IC (e.g., for the circuit of FIG. 2) implemented according to aspects of the present invention is described next.

6. Test Vector Generation

Figures 6, 7:
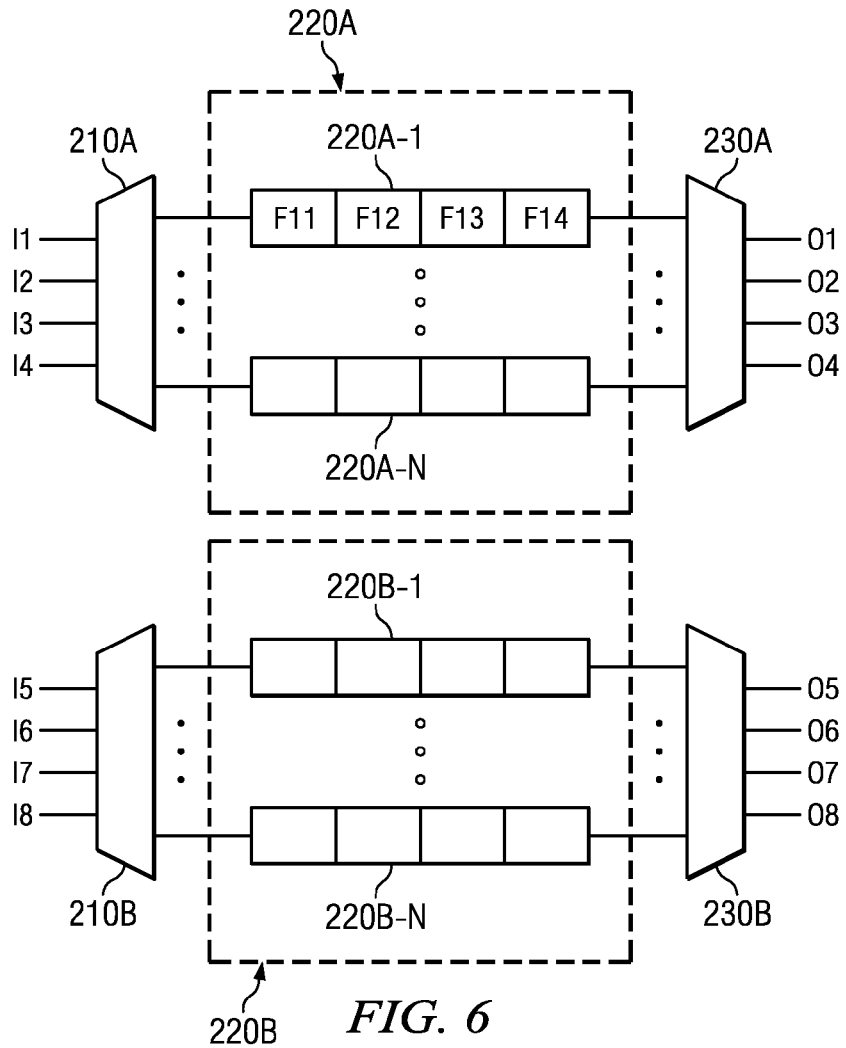
FIG. 6 is a diagram depicting design information of an IC provided as input to an ATPG tool, in an embodiment of the present invention.
FIG. 7 is a diagram illustrating example test vectors/bits generated by an ATPG tool in an embodiment.

FIG. 6 is a diagram depicting design information of IC 200 that is provided as input to an ATPG (Automatic Test Pattern Generation) tool. Although shown as a circuit diagram in FIG. 6, the design information provided to the ATPG tool is the netlist (specifying the components, interconnections, and properties of components/interconnections) corresponding to the structure of FIG. 6. Again, for ease of description, it is assumed that IC 200 contains only two partitions 220A and 220B, each shown containing 'N' chains respectively (220A-1 through 220A-N, and 220B-1 through 220B-N).

Each of the chains is shown as containing four flip-flops, with the flip-flops in chain 220A-1 shown labeled (F11 through F14). In general, however, the netlist will contain details of as many partitions and components as the actual structure of IC 200 (FIG. 2). All information related to the circuit structure of Partitions 220A and 220B, together with the control structure (test controller 500) shown in FIG. 5 is provided to the ATPG tool.

Based on the information thus provided, an ATPG tool generates test vectors for testing each of the partitions, which can then be provided in a desired manner (overlapping or not, as described with respect to FIGS. 4A and 4B) during execution of the tests. The generated test vectors/bits in an embodiment, are shown in FIG. 7. In FIG. 7, test bits (700) are shown containing bits P11 through P14, P21 through P24, P31 through P34, P41 through P44, P51 through P54, P61 through P64, P71 through P74, and P81 through P84. Tester 110 can then be programmed to test IC 200, as briefly noted below. Some examples of tester 110 are FUSION™ tester from LTX Corporation, VLCT™ tester from Texas Instruments and OCELOT™ tester from Verigy, etc.

Assuming that it is desired to shift-in the test vectors into the two partitions 220A and 220B sequentially (e.g., shift into partition 220A followed by shift into partition 220B), bits P14, P24, P34 and P44 are shifted-in into partition 220A in one clock cycle, followed by bits (P13, P23, P33 and P43), (P12, P22, P32 and P42) and (P11, P21, P31 and P41) in following successive clock cycles. Bits (P54, P64, P74 and P84), (P53, P63, P73 and P83), (P52, P62, P72 and P82) and (P51, P61, P71 and P81) are then shifted-in into partition 220B in corresponding successive clock cycles.

Once the shifting-in is completed as described above, capture cycles are generated (again either simultaneously or in a non-overlapping manner, based on corresponding partition enable signals for the capture phase), the response bits of combinational logic are captured, and shifted out. Again, the shifting-out can be performed in parallel or in a non-overlapping manner. The manner in which launch off capture test is performed in an embodiment based on the test vectors generated, is illustrated below.

7. Timing Diagram of Launch off Capture Test

FIGS. 8A and 8B are diagrams illustrating example waveforms representing an LOC (Launch off Capture, also termed stuck-at fault tests) scan test performed with test vectors generated as noted above. With respect to FIG. 8A, interval 811 and 812 respectively represent the scan-in and scan-out durations of test and response vectors respectively, each of which contains four clock cycles corresponding to the four serially connected storage elements in the scan chains of partitions 220A and 220B. Interval t80-t81 represents a capture phase, and contains launch pulses 813 (for partition 220A) and 815 (for partition 220B), and capture pulses 814 (for partition 220A) and 816 (for partition 220B). In the example of FIG. 8A the scan-in, capture and scan-out phases for each of the two partitions are shown to overlap.

With respect to FIG. 8B interval 817 and 819 represent scan-in intervals of test vectors for partitions 220A and 220B respectively, while interval 818 represents a scan-out interval of response vectors for both partitions. Again, each of the scan-in and scan-out phases is shown performed with respect to four clock cycles, in turn corresponding to the four serially connected storage elements in the scan chains of partitions 220A and 220B. Interval t82-t83 represents a capture phase, and contains launch pulses 820 (for partition 220A) and 822 (for partition 220B), and capture pulses 821 (for partition 220A) and 823 (for partition 220B).

In the example of FIG. 8B, capture and scan-out phases for each of the two partitions overlap, while the scan-in phases for the two partitions are sequential. Other combinations of scan-in, capture and scan-out phases can also be used, as noted in sections above. There can also be a varying number of capture pulses in any partition, (0, 1 or more), to support different forms of sequential ATPG, as well to provide coverage of logic residing in between the partitions. Further, in the Figures of 8A and 8B, the frequencies of clocks 221A and 221B are shown to be the same merely for illustration. However, in general, the frequencies can be different, along with corresponding changes to the scan-in, scan-out and capture phases of the diagrams of FIGS. 8A and 8B.

The approaches described above with respect to LOC tests may not be able to support launch-on shift (LOS) tests, another type of scan test generally designed to capture transition faults, also termed delay test. In LOS testing also, inputs to combinatorial circuitry from a scan chain are provided so as to cause a transition to occur in a node/net of the combinatorial circuitry before a following capture cycle. However, in contrast to LOC test approach, the launch value is provided directly from the scan chain in the last shift clock cycle used to launch the transition. A capture cycle is generated after a duration equal to one clock period of the functional clock. The output values are captured, shifted out, and analyzed in tester 110 for potential faults.

Thus, in LOS testing the last bit shifted into a scan chain is required to cause the transition in the combinatorial logic being tested. However, from FIG. 8B, it may be observed that there may be an unacceptably large time interval 'td' between the occurrence of the launch pulse (last test bit shifted-in) in scan chains in partition 220A and the occurrence of the capture pulse 821. Such delay 'td' may be too large to capture any signal transition-related faults.

It is noted that for effective transition fault testing, the delay between the time instance of generation of transition of data value in the corresponding combinatorial circuit/element or interconnection net and the capture time instance must generally not exceed one functional clock period (typically the period of the clock used during actual operation, as against during scan tests). An embodiment of the present invention addresses the requirements noted above, and is described next.

7. Enhancement for LOS Testing

Figure 9:
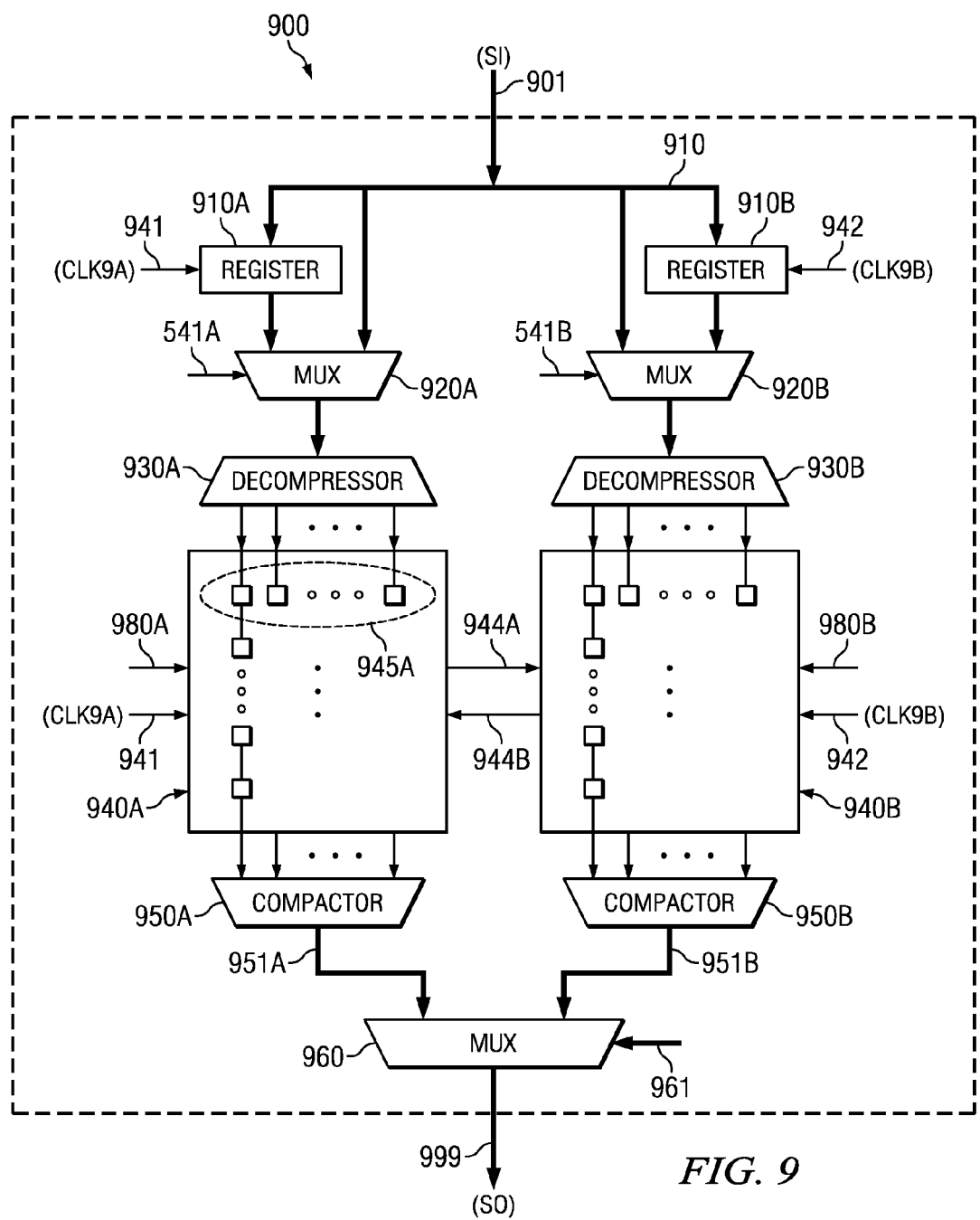
FIG. 9 is a block diagram of an IC that supports transition fault testing, in an embodiment of the present invention.

FIG. 9 is a block diagram of an IC in another embodiment of the present invention that supports LOS (launch-on shift) transition fault testing, while still providing the benefits of enhanced control such as reducing power consumption, reduced or not impact on test coverage or the test application time. IC 900 is shown containing registers (or storage elements, in general) 910A and 910B, MUX 920A and 920B, decompressors 930A and 930B, partitions 940A and 940B, compactors 950A and 950B, and MUX 960. For conciseness and ease of description, only two partitions and corresponding circuitry (decompressors, compactors, etc.) are shown in FIG. 9. However, alternative embodiments can be implemented with more than two partitions (along with corresponding decompressors, compactors, and registers) without departing from the scope and spirit of several aspects of the present invention.

Decompressors 930A and 930B, partitions 940A and 940B, compactors 950A and 950B, and MUX 960 are implemented (as well as operate) similar to the corresponding components described above with respect to FIG. 2, and the description is not repeated here in the interest of conciseness. Scan enable signals 980A and 980B are provided to respective partitions 940A and 940B. Respective clocks CLK9A and CLK9B are provided to the partitions via paths 941 and 942 respectively.

MUX 960 provides one of inputs 951A and 951B on scan output signal lines/pins 999 (SO), based on control input 961. Path 901 may represent multiple scan-in (SI inputs) signal lines, a desired number of signal lines being provided to register 910A (as well as MUX 920A) and register 910B (as well as MUX 920B).

The bits in path 901 (SI) corresponding to partition 940A are provided both to register 910A as well as MUX 920A. Similarly, the bits in path 901 (SI) corresponding to partition 940B are provided both to register 910B as well as MUX 920B. Registers 910A and 910B are clocked by respective clocks 941 (CLK 9A) and 942 (CLK 9B). While MUX 920A and 920B are shown prior (in the signal path) to decompressors 930A and 930B respectively (to reduce the required bit width for the registers), alternative embodiments can be implemented to place a register after decompressor (or other locations), without departing from the scope and spirit of several aspects of the present invention, as will be apparent to one skilled in the relevant arts by reading the disclosure herein. Registers placed after the decompressor can also provide hybrid control of individual scan chains wherein in some scan chains, a transition is launched using the scan shift path and in some scan chains it is launched using the launch capture clock.

Register 910A stores the corresponding bits (on signal lines in path 901(SI) that are desired to be provided to partition 940A) of input signals 901(SI) on an active edge (or active level) of clock CLK9A. Register 910B stores the corresponding ones of input signals 901(SI) on an active edge (or active level) of clock CLK9B. Clocks 941 (CLK9A), 942 (CLK9B), scan enable signals 980A and 980B, and MUX select signal 961 may be provided by a controller similar to test controller 270, or directly from a tester (such as tester 110).

Figures 10A, 10B:
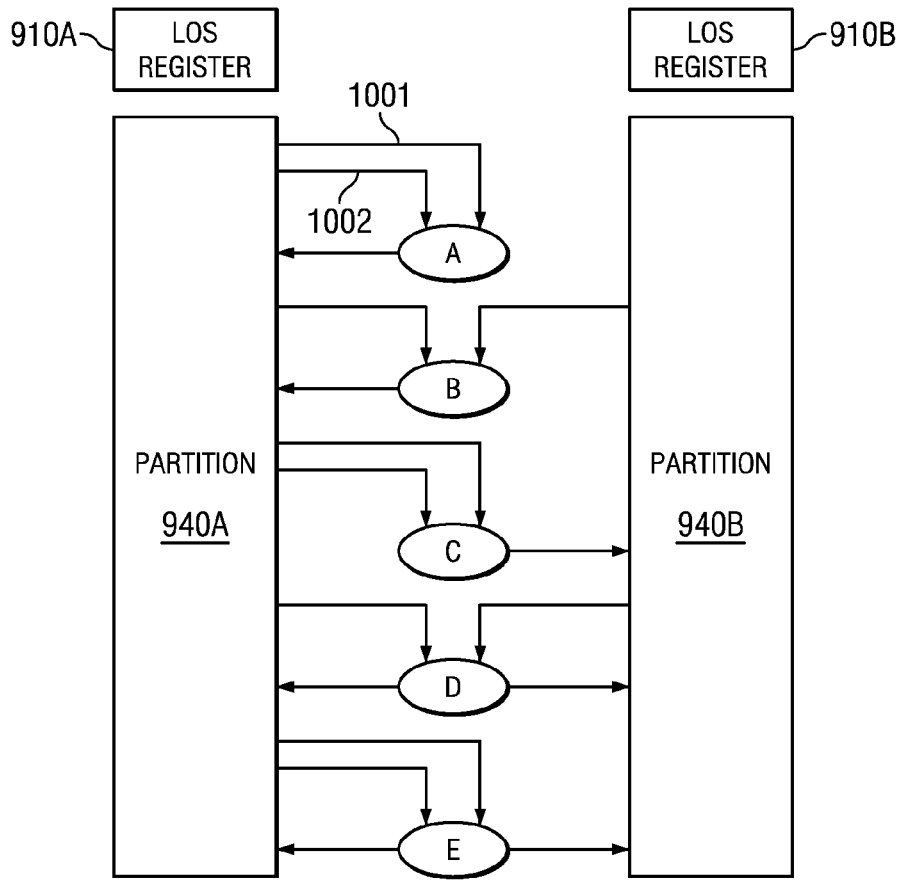
FIG. 10A is a simplified block diagram illustrating example test scenarios for an launch-on shift (LOS) test.
FIG. 10B is a diagram of an example table specifying partitions in which launch and capture pulses are to be applied, in an embodiment.

Several scenarios may be desired to be tested, and accordingly, FIG. 10A illustrates some example scenarios. In that Figure, for convenience the corresponding decompressors and compactors of FIG. 9 have been omitted. Oval blocks marked A, B, C, D and E each represent one or more blocks of combinatorial logic required to be tested for transition faults. Block A receives 'launch' inputs (data on paths 1001 and 1002 that cause a logic transition in the combinatorial logic of block A), and provides a corresponding combinatorial output back to partition 940A.

Block B receives 'launch' inputs from each of partitions 940A and 940B, and provides a corresponding combinatorial output back to partition 940A. Block C receives 'launch' inputs from partition 940A, and provides a corresponding combinatorial output to partition 940B. Block D receives 'launch' inputs from each of partitions 940A and 940B, and provides corresponding combinatorial output back to each of partitions 940A and 940B. Block E receives 'launch' inputs from partition 940A, and provides corresponding combinatorial output back to each of partitions 940A and 940B.

An example table containing desired phases of a scan test (scan-in, capture or scan-out) to be performed with respect to the structure of FIG. 10A is provided in the table of FIG. 10B. Column 1070 of the table lists the block to be tested. Column 1071 lists the corresponding test phases with 'L' representing launch, 'C' representing capture, and P1 and P2 representing partition 1 and partition 2 respectively. It may be noted that the 'test cases' of the table of FIG. 10B correspond to the scenarios of FIG. 10A.

The clock waveforms of FIGS. 10C, 10D, 10E, 10F and 10G correspond respectively to the five test cases of rows 1080, 1081, 1082, 1083 and 1084 of FIG. 10B. In the Figures clock pulses labeled 'S' denote shift-in pulses (not including the last shift-in pulse, which is labeled as 'L'-launch pulse). Capture pulses are labeled 'C' in the waveforms. For simplicity, shift-in phases in the waveforms are deemed to require only three clock cycles.

Figure 10C:
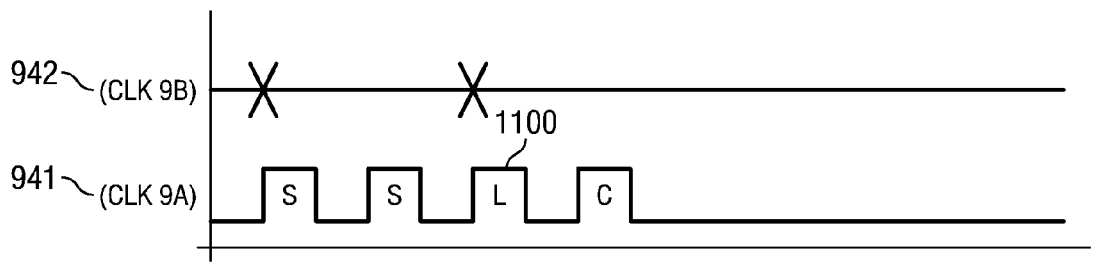
FIGS. 10C through 10G are timing diagrams corresponding to the test scenarios listed in the table of FIG. 10B.

Thus, in the waveform of FIG. 10C shift-in, launch (1100) and capture pulses are generated (provided) from partition 1, and the corresponding capture is also performed in partition 1 (P1). Partition 2 (P2) is not tested as indicated by the flat line. In the waveform of FIG. 10E shift pulses (including the launch pulse 1104) are generated (provided) from P1, while the corresponding capture is performed in P2.

Figure 10D:
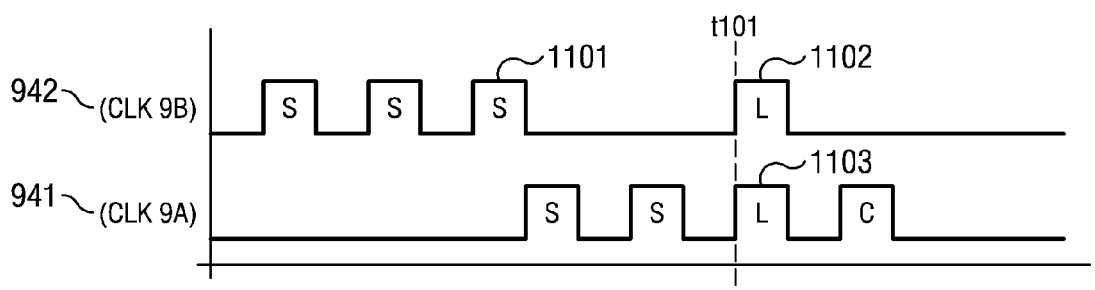
Figure 10E:
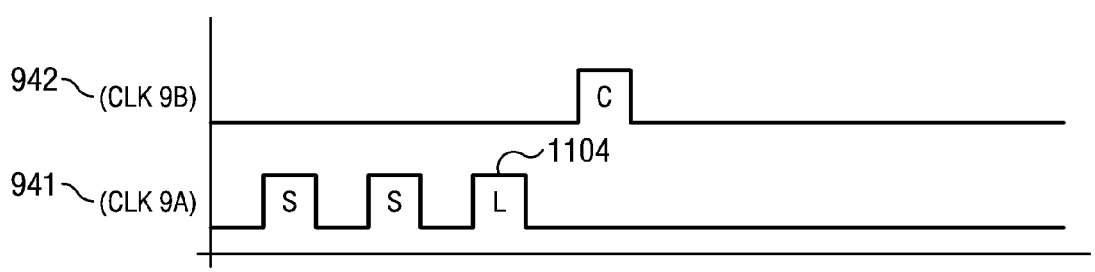
Figure 10F:
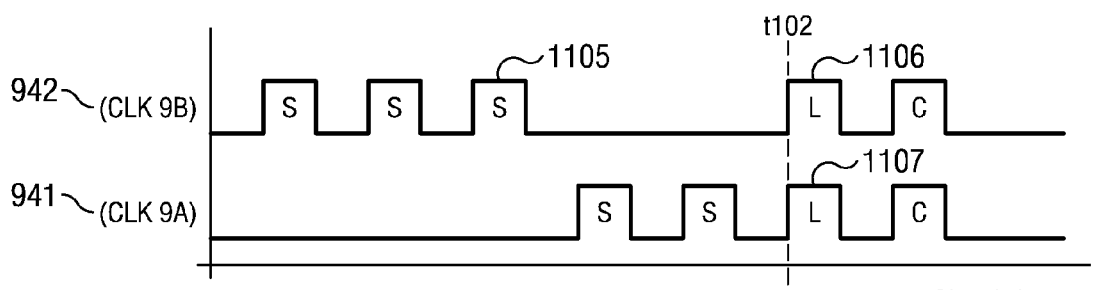
Figure 10G:
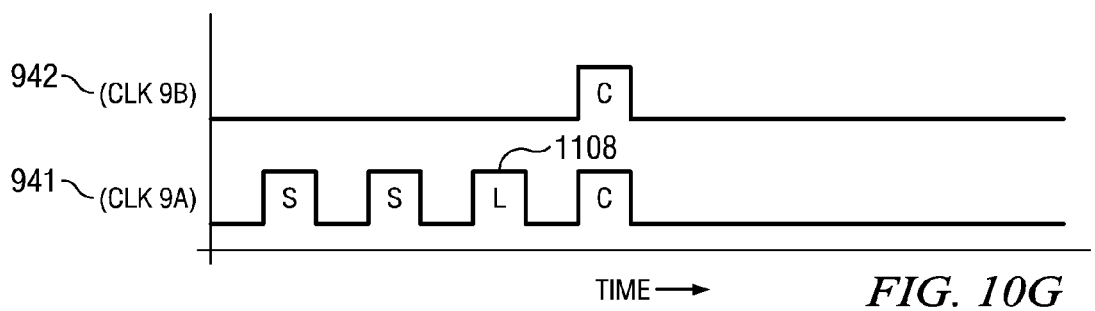

In the waveform of FIG. 10G shift pulses (including the launch pulse 1108) are generated (provided) from P1, and the corresponding capture is performed in both P1 and P2. The data bits for the scan-in phases in the waveforms of FIGS. 10C, 10E and 10G are provided to the respective decompressors 930A and 930B directly from path 901(SI), i.e., select signals 541A and 541B provide inputs on path 901 (SI) to the respective decompressors.

With respect to FIG. 10D, shifting-in into P2 is performed first, followed by shifting-in into P1. Since the transition desired to be tested is to be launched from both P1 and P2, it may be noted that due to the sequential shifting in of test bits, the shift-in pulse 1101 (corresponding to the last bit shifted-in) from P2 occurs much earlier (at least one clock cycle earlier than the clock period during normal operation) than the capture pulse in P1. Hence, it may not be possible to accurately test block B for delay (transition fault).

Therefore, launch pulse 1102 from P2 is provided (from register 910B) in synchronicity with launch pulse 1103 from P1, immediately prior to the capture pulse in P1. At (or just prior to) time instance t101, select signal 541B is provided to cause the data output of register 910B to be forwarded as the output of MUX 920B. Data (from P1) corresponding to launch pulse 1103 may be provided either from register 910A or directly from SI (901).

With respect to FIG. 10F, shifting-in into P2 is performed first, followed by shifting-in into P1. Again, since the transition desired to be tested is to be launched from both P1 and P2, it may be noted that due to the sequential shifting in of test bits, the shift-in pulse 1105 (corresponding to the last bit shifted-in) from P2 occurs much earlier than the capture pulse in P1. Hence, it may not be possible to accurately test block B for delay (transition fault).

Therefore, launch pulse 1106 from P2 is provided (from register 910B) in synchronicity with launch pulse 1107 from P1, immediately prior to the capture pulse in both P1 and P2. At (or just prior to) time instance t102, select signal 541B is provided to cause the data output of register 910B to be forwarded as the output of MUX 920B. Data (from P1) corresponding to launch pulse 1107 may be provided either from register 910A or directly from SI (901).

Thus, the use of registers 910A and 910B to provide the last (launch) bit when performing transition fault tests, enables such tests to be performed accurately. In general, a register (such as 910A or 910B) may be provided for each partition in the IC.

Another aspect of the present invention reduces the number of SI and SO pins required to be provided on an IC, without adversely affecting the level of compression obtainable and test quality/test coverage, as described next with respect to an embodiment.

5. Reducing the Number of Test Pins

Figure 11:
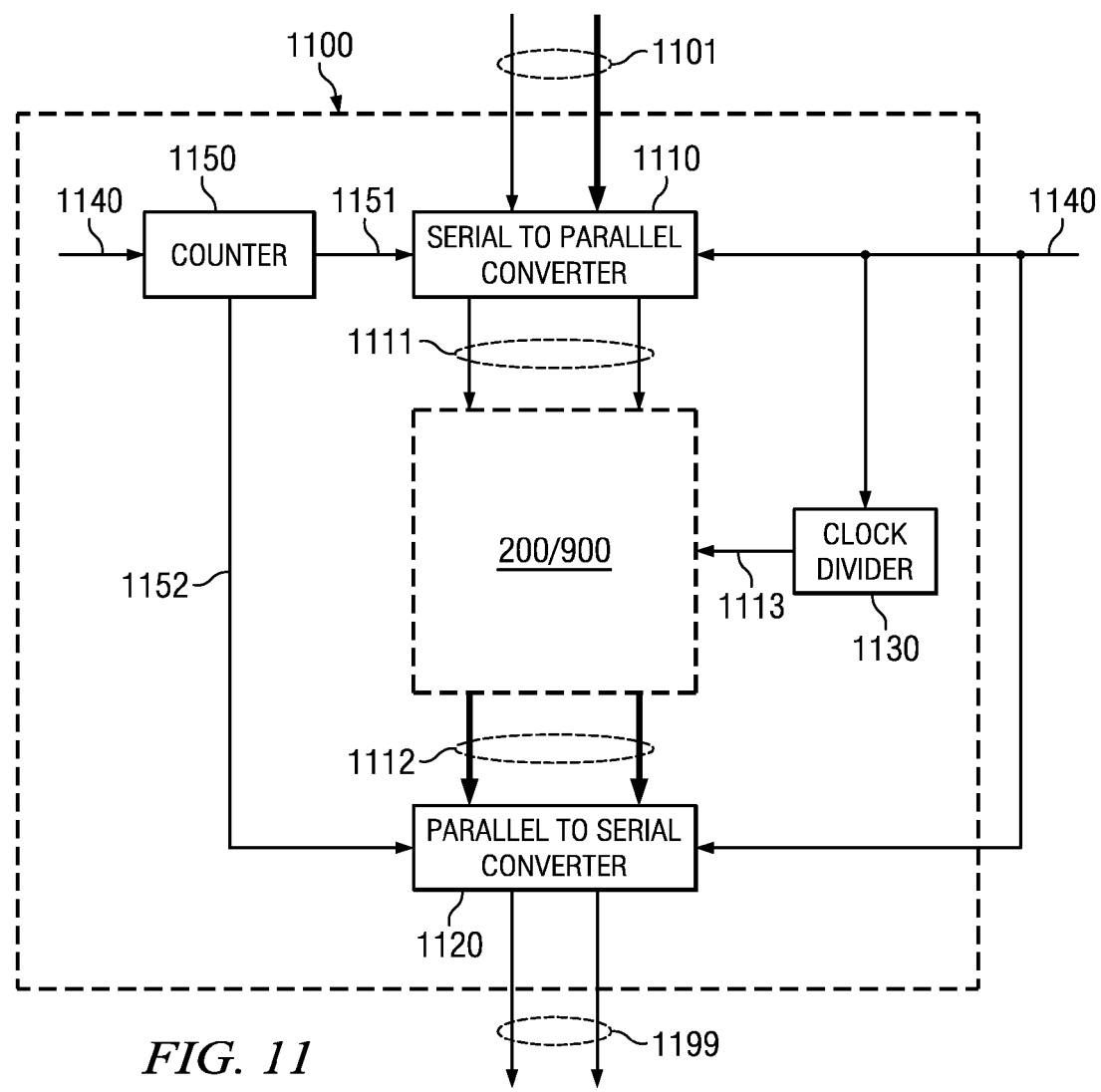
FIG. 11 is a block diagram of an IC with reduced number of test pins for scan tests, in an embodiment.

FIG. 11 is a block diagram of an IC with reduced number of test pins for scan tests, in an embodiment. IC 1100 is shown containing serial to parallel converter 1110, parallel to serial converter 1120, clock divider 1130, counter 1150, and portion labeled 200/900. Portion 200/900 is similar or identical to the structure of IC 200 of FIG. 2 or IC 900 of FIG. 9, and the internal details are not described here again in the interest of conciseness. Also, test controller similar to controller 270 may be implemented within IC 1100, but not shown in FIG. 11. For conciseness, various signals (such as for reset signal to blocks of FIG. 11) are not shown.

Clock 1140 controls/coordinates the operations of serial to parallel converter 1110 and parallel to serial converter 1120. Clock divider 1130 divides clock 1140 by a factor (typically an integer) and provides the divided clock on path 1113 to portion 200/900. In general, the divide factor depends on the ratio of the width of data on path 1101 to the width of data on path 1111. For example, if 4 bits are received per clock cycle of clock 1140 on path 1101, and serial to parallel converter 1110 combines two such 4-bit data inputs to form a single 8-bit data output, then the divide ratio will be 2.

Serial to parallel converter 1110 receives on path 1101 an N-bit wide test data per clock cycle of clock 1140. Serial to parallel converter 1110 combines multiple sets of N-bit data received over a corresponding number of multiple clock cycles to form an M-bit wide data (with M greater than N), and forwards the M-bit data to portion 200/900 on path 1111, which contains multiple (M) lines. As an example, assuming portion 200/900 is designed to receive an eight-bit wide input in each clock cycle of clock 1113, path 1111 would contain/ represent eight paths. Path 1101 may, for example, be four bits wide. Thus, serial to parallel converter 1110 would be implemented as a 4-to-8 converter, and combines two 4-bit inputs on path 1101 to provide one 8-bit data value on path 1111.

Parallel to serial converter 1120 receives on path 1112 a P-bit wide data (response bits captured in a scan test) per clock cycle of clock 1140. The clock frequency of clock 1113 equals the scan-out frequency of response bits, and a scan out cycle equals one clock cycle of clock 1113. Parallel to serial converter 1120 splits the P-bit data to form multiple Q-bit data (with P greater than Q), and forwards the Q-bit data on path 1199 over a corresponding number of multiple clock cycles. As an example, assuming portion 200/900 is designed to provide eight-bit wide outputs (response bits) in each clock cycle of clock 1113, path 1112 would contain/represent eight paths. Path 1199 may, for example, be four bits wide. Thus, parallel to serial converter 1120 would be implemented as a 8-to-4 converter, and splits each 8-bit data received on path 1112 to two 4-bit data forwarded on path 1199.

With respect to the operation of serial to parallel converter 1110, it is noted that the output data that is formed from input data are simply concatenated. Thus, there is no correlation between the bits of the output data (path 1111). Such operation is noted here to clearly distinguish from the operation of a decompressor (e.g., of FIGS. 2 and 9), which may provide a same input bit on multiple output lines, The output bits provided by a decompressor are thus correlated with respect to each other. A compactor and parallel to serial converter 1120 differ in a similar manner.

Counter 1150 controls the operations of serial to parallel converter 1110 as well as that of parallel to serial converter 1120, as described below with the example diagrams of FIGS. 12 and 13. Counter 1150 is designed to count in a circular manner to twice the factor representing the ratio of clock frequency of clock 1140 to clock 1113, i.e., the counter is a modulo [2*factor] counter.

It may be appreciated that the provision of serial to parallel converter 1110 and parallel to serial converter 1120 enables IC 1100 to be implemented to have fewer external pins (1101 and 1199) for test purposes, while providing wider (and non-correlated) test bits internally to the scan chains. Such an approach enables high test coverage, while still requiring relatively fewer external pins.

It is noted that the alternative approach of using fewer input pins for decompressors and fewer output pins for compactors may result in poor test coverage. Another alternative approach may be to implement higher compression in the test vectors themselves. However, higher compression generally adversely affects test coverage. With the approach of FIG. 11, an IC may be implemented with reduced test/scan pins (SI and SO), while not facing reduced test coverage. The expansion of external test data from tester and compaction of internal test data from the IC can be made scaleable to obtain the right tradeoffs in test time (due to scan compression) for a given test coverage, and drives the selection of the division value in the clock divider (clock divider 1130 in FIG. 11).

Figure 12:
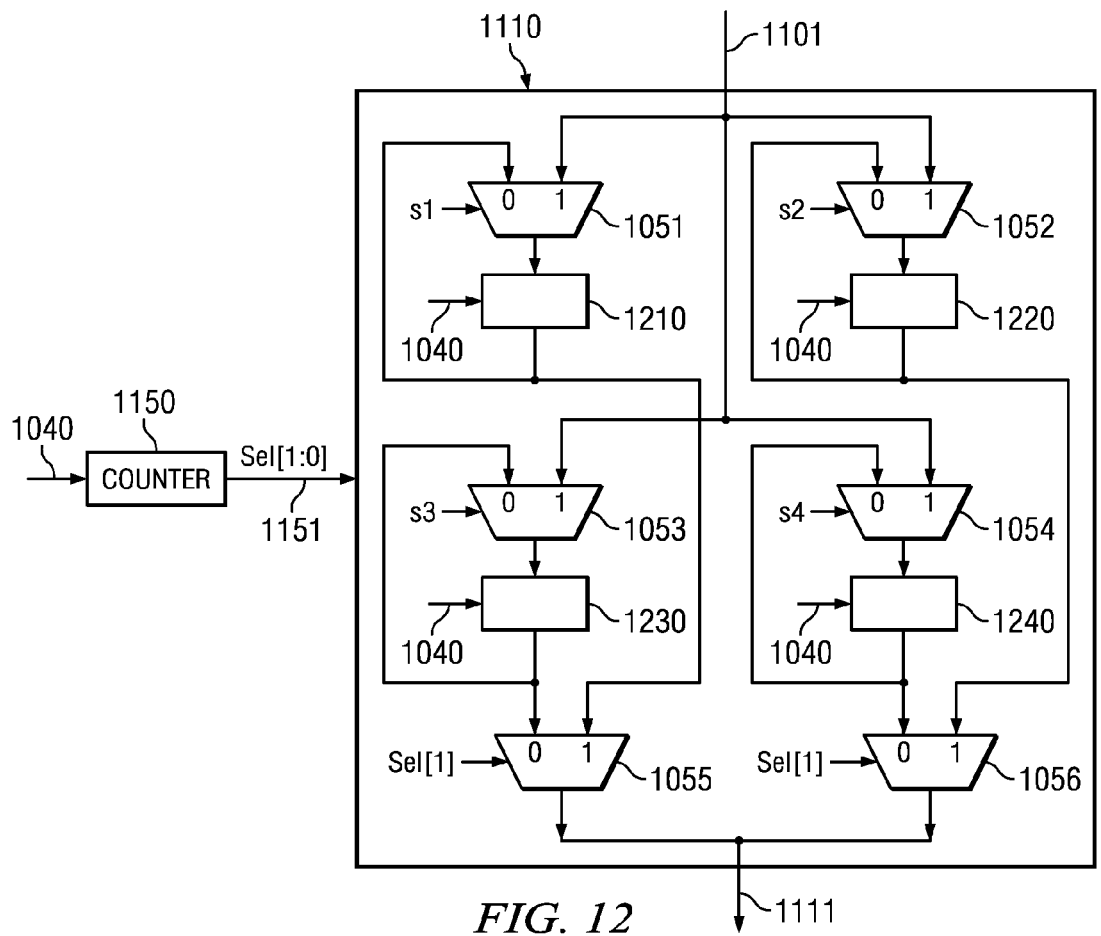
FIG. 12 is a block diagram illustrating the manner in which a serial to parallel converter is implemented, in an embodiment of the present invention.

FIG. 12 is a block diagram illustrating the manner in which serial to parallel converter 1110 is implemented, and operates under control from counter 1150. In the example, it is assumed that serial to parallel converter 1110 receives a 4-bit input on path 1101, and provides an 8-bit output on path 1111.

Counter 1150 is implemented as a two-bit binary counter, clocked by clock 1040, and provides a two bit output on path 1151. The two-bit output is referred to below for convenience as Sel [1:0]. Each of blocks 1210, 1220, 1230 and 1240 represents a 4-bit register and is clocked by clock 1040.

The select inputs of multiplexers (MUX) 1051, 1052, 1053 and 1054 (input multiplexers) are defined as below:
s1 represents the state "00" of Sel [1:0]
s2 represents the state "01" of Sel [1:0]
s3 represents the state "10" of Sel [1:0]
s4 represents the state "11" of Sel [1:0]

Thus, MUX 1051 selects input 1101 as its output when s1 equals "00", and the other input as its output otherwise. MUXes 1052, 1053 and 1054 operate correspondingly. The higher order output bit of Sel [1:0] is provided as the select signals to MUXes 1055 and 1056 (output multiplexers).

In operation, when counter output is "00", the 4-bit data on path 1101 (i.e., having 4 lines) is stored in register 1210. In the next clock cycle of clock 1040, counter output is "01", and the (next) 4-bit data on path 1101 is stored in register 1220. In the next clock cycle of clock 1040, counter output is "10", and the (next) 4-bit data on path 1101 is stored in register 1230. Also, counter output of "10" provides the data stored in registers 1210 and 1220 as an 8-bit data on output 1111. In the next clock cycle of clock 1040, counter output is "11", and the (next) 4-bit data on path 1101 is stored in register 1240. The 8-bit data previously provided on path 1111 continues to be present on the path.

In the next clock cycle of clock 1040, when counter output is again "00", the next 4-bit data on path 1101 is stored in register 1210. Also, counter output of "00" provides the data stored in registers 1230 and 1240 as an 8-bit data on output 1111. In the next clock cycle of clock 1040, counter output is "01", and the (next) 4-bit data on path 1101 is stored in register 1220. The 8-bit output of the previous clock cycle continues to be provided on path 1111. The above cycles repeat, and serial to parallel converter 1110 continues to provide 8-bit outputs formed from two four-bit inputs.

While the description of above is provided with respect to factor (frequency ratio) of 2 for illustration, it should be appreciated that the extension of such features to higher factors will be apparent to a skilled practitioner. According to one approach, for a factor of N, there would be (2×N) units/combinations of (or similar to) MUX 1051 and register 1210, with the units organized as 2 rows and N columns. As described above, the data units received on path 1101 may be stored in row-wise fashion, while moving to successive columns after storing in all units of a row. N output multiplexors (such as 1051) would be employed to select the data stored in one row of registers in each output clock cycle.

Figure 13:
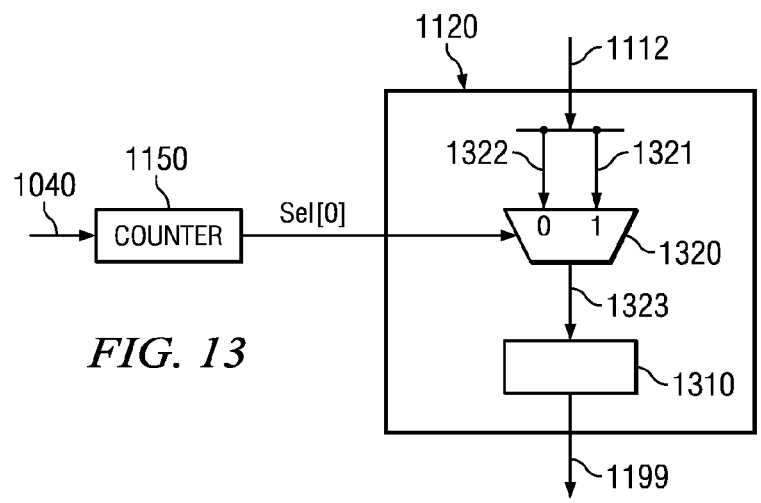
FIG. 13 is a block diagram illustrating the manner in which a parallel to serial converter is implemented, in an embodiment of the present invention.

FIG. 13 is a block diagram illustrating the manner in which an embodiment of parallel to serial converter 1120 is implemented, and operates under control from counter 1150. In the example, it is assumed that parallel to serial converter 1120 receives an 8-bit input on path 1112, and provides a 4-bit output on path 1199. The lower order (zero position) bit (Sel[0]) of the two-bit output of counter 1150 is provided as the select input to MUX 1320. Register 1310 is a 4-bit register. The upper 4-bits of the 8-bits of path 1112 are provided on path 1322, while the lower 4-bits of the 8-bits of path 1112 are provided on path 1321. In operation, when Sel [0] equals 0, the input on path 1321 is stored in register 1310, and provided as output 1199. When Sel [0] equals 1, the input on path 1322 is stored in register 1310, and provided as output 1199.

References throughout this specification to "one embodiment", "an embodiment", or similar language mean that a particular feature, structure, or characteristic described in connection with the embodiment is included in at least one embodiment of the present invention. Thus, appearances of the phrases "in one embodiment", "in an embodiment" and similar language throughout this specification may, but do not necessarily, all refer to the same embodiment.

While various embodiments of the present invention have been described above, it should be understood that they have been presented by way of example only, and not limitation. Thus, the breadth and scope of the present invention should not be limited by any of the above-described embodiments, but should be defined only in accordance with the following claims and their equivalents.

What is claimed is:

1. An integrated circuit (IC) comprising:
a plurality of memory elements operable as a plurality of scan chains, said plurality of scan chains grouped into a plurality of partitions whereby scan chains of each partition are enabled together via a corresponding partition enable signal, each scan chain connected to a Test Data Input to receive test data; and
a test controller including a plurality of blocks, each block corresponding to one of said plurality of partitions, each block including
a delay register storing digital data therein having a input receiving a digital data input and an output generating a digital data output,
a count register storing a digital count therein having an input connected to said output of said corresponding delay register and an output generating a digital data output,
a delay element having a first input receiving said digital data stored in a corresponding delay register, a second input and an output generating a digital data output having a predetermined state a predetermined time after receiving an input at said second input, said predetermined time corresponding to said digital data stored in a corresponding delay register, a counter having a trigger input connected to said output of said delay element and a count output generating a digital output corresponding to a count therein, said counter counting beginning upon receipt of a predetermined state at said trigger input, a comparator connected to said count register and said counter comparing said digital count stored in said count register with said count of said counter and generating a match signal when said digital count stored in said count register matches said count of said counter;

an inverter having an input connected to receive said match signal of said comparator and an output, and an AND gate having a first input connected to receive said output of said delay element, a second input connected to receive said output of said inverter and an output generating said partition enable signal to a corresponding partition of scan chains, said plurality of blocks of said test controller disposed serially from a first block through a last block whereby said input of said delay register of said first block receives said Test Data Input, said input of said delay register of each subsequent block receives said output of said count register of a prior block, said input of said delay element of said first block receives a global start signal and said input of said delay element of each subsequent block receives said match signal of said comparator of a prior block; and said Test Data Input being received from a set of pins connected to an external tester, wherein the number of said set of pins is less than the number of said plurality of scan chains.

2. The integrated circuit (IC) of claim 1, wherein:
each of said blocks of said test controller except said first block further includes
a logic bypass register storing a single bit therein having an input connected to said output of said corresponding count register and an output connected to said input of said delay register of said subsequent block, and
a multiplexer having a first input receiving said global start signal, a second input receiving said match signal of said comparator of said prior block, a control signal receiving said single bit stored in said bypass register and an output connected to said trigger input of said delay element, said multiplexer outputting either said first input or said second input on said output dependent upon a digital state of said single bit stored in said corresponding bypass register.

3. The integrated circuit (IC) of claim 1, wherein:
each of said blocks of said test controller further includes an AND gate having a first input receiving a global master clock, a second input receiving said corresponding partition enable signal and an output supplying a clock input to said corresponding partitions of scan chains.

4. The integrated circuit (IC) of claim 1, wherein:
each of said blocks of said test controller further includes an AND gate having an input receiving a global scan enable signal, a second input receiving said corresponding partition enable signal and an output supplying an enable input to said corresponding partition of scan chains.

* * * * *